Jan. 10, 1956 A. WINTERS 2,730,577

FREQUENCY SELECTIVE AMPLIFIER CIRCUIT

Filed March 9, 1954

INVENTOR.
ARTHUR WINTERS
BY P. E. Henninger
ATTORNEY

United States Patent Office 2,730,577

Patented Jan. 10, 1956

2,730,577

FREQUENCY SELECTIVE AMPLIFIER CIRCUIT

Arthur Winters, New York, N. Y.

Application March 9, 1954, Serial No. 415,059

4 Claims. (Cl. 179—171)

Figure 1:
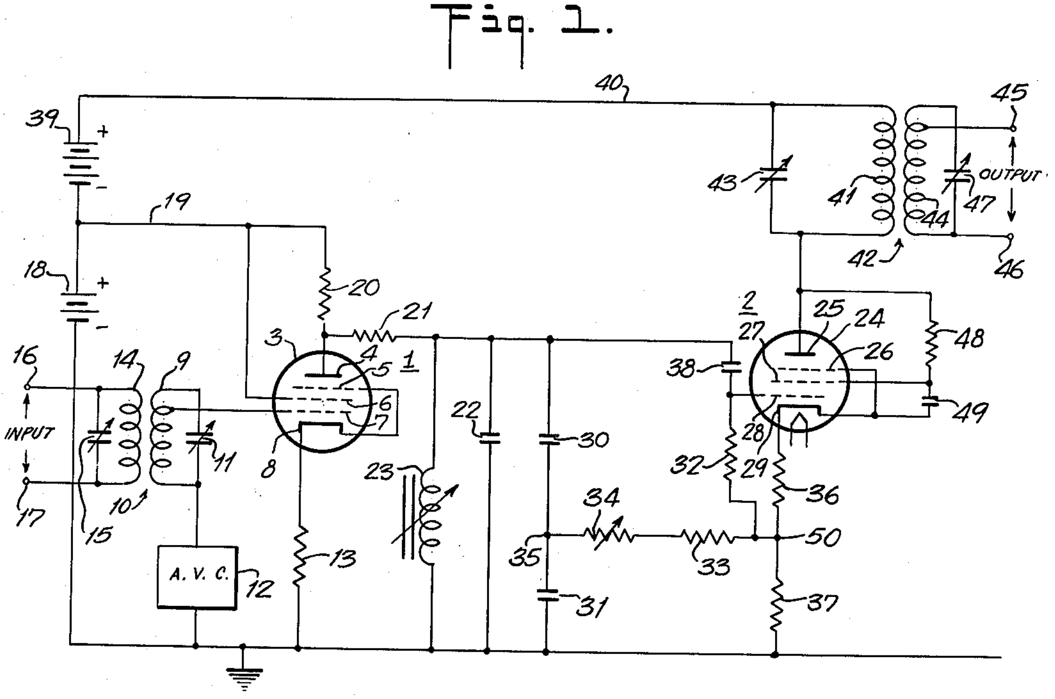

This invention relates to frequency selective amplifier circuits and especially to circuits which are highly selective over a very narrow band of frequencies.

The invention is described herein as applied to an intermediate frequency amplifier stage in a superheterodyne circuit. While certain features of the invention are of especial utility in connection with circuits of that specific type, other features are of more general utility.

In any case where it is desired to amplify a narrow range of frequencies such as a carrier frequency and its side bands, the gain obtained from a given amplifier stage may be increased by making that stage frequency selective. This is commonly done by providing a parallel resonant circuit in the input circuit of the amplifier stage, the output circuit, or both. The selectivity of such a resonant circuit is measured by a quantity known as the Q of the circuit, which may be defined as the ratio of the resistance to the inductive impedance. The higher the Q, the more selective the circuit.

It has been suggested to increase the Q of a resonant circuit by the use of a negative resistance device connected in parallel with the resonant circuit and having a negative resistance substantially equal to the positive resistance in the resonant circuit. It has also been proposed to use as such a negative resistance device, an amplifier stage including a positive feedback between the output and input circuits. One type of amplifier stage having positive feedback is known as a cathode follower circuit because of the fact that the load impedance is connected between the cathode and the source of electrical energy with the result that the varying potential developed across the load impedance causes the cathode potential to follow variations in the control grid potential. Circuits having positive feedback tend to be unstable and to oscillate. It has been proposed to prevent oscillation in such a circuit by the use of various expedients such as a resistance load on the resonant circuit, or by employing a negative feedback concurrently with the positive feedback.

An object of the present invention is to provide an amplifier circuit employing the foregoing principles, but having a higher Q and capable of being tuned more sharply to a particular frequency without becoming unstable than the circuits of the prior art.

Another object of the invention is to provide a circuit of the type described which will amplify incoming signals of a frequency within a band whose width is adjustable.

Another object of the invention is to provide a circuit of the type described in which the frequency may be shifted.

The foregoing and other objects of the invention are attained, in the circuit described herein, by providing two stages of amplification, with the output circuit of the first stage coupled to the input circuit of the second stage through a high resistor in series with a parallel resonant circuit. The input circuit of the second stage is coupled to an intermediate point in the resonant circuit so as to have the advantage of the passive gain in that resonant circuit. The second stage is provided with both positive and negative feedback. The positive feedback is provided to give a negative resistance effect to balance the positive resistance in the resonant circuit. The negative feedback is provided to stabilize the circuit and prevent the development of oscillations.

Other objects and advantages of the invention will become apparent from a consideration of the following specification and claims, taken together with the accompanying drawings.

Figure 2:
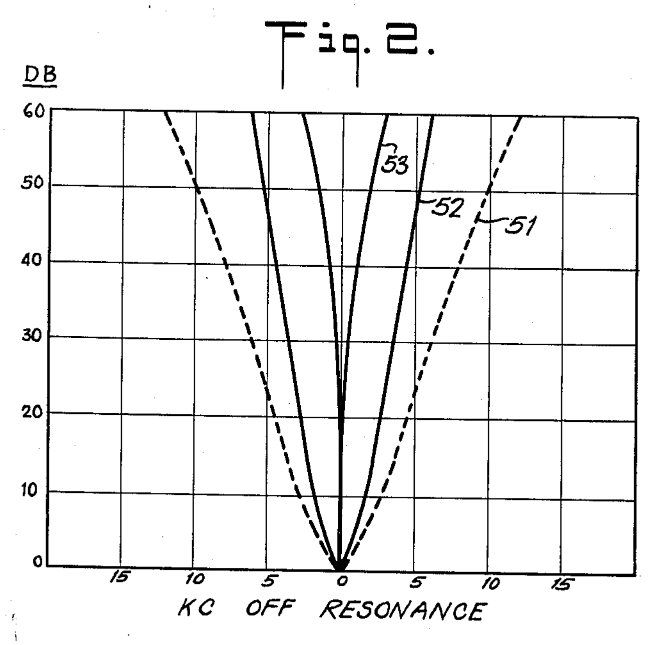

In the drawings:

Fig. 1 is a wiring diagram of an intermediate frequency amplifier circuit embodying the invention; and Fig. 2 is a graphical illustration of the improvement in selectivity which is obtainable by the use of a circuit such as that illustrated in Fig. 1.

Referring to Fig. 1, there is illustrated an intermediate frequency amplifier circuit including a first amplification stage generally indicated at 1 and a second stage generally indicated at 2.

The stage 1 includes a pentode tube 3, which may be of the type commercially known as 6BA6, having an anode 4, control electrodes 5, 6 and 7 and a cathode 8.

The input circuit of stage 1 is connected between control grid 7 and cathode 8, and may be traced from control grid 7 through the secondary winding 9 of a coupling transformer generally indicated at 10, a variable tuning condenser 11 connected in parallel with secondary winding 9, thence through an automatic volume control circuit of conventional type, schematically indicated at 12, to ground, and thence through a resistor 13 to cathode 8.

Input signals reach the stage 1 through primary winding 14 of the coupling transformer 10. A variable tuning condenser 15 is connected in parallel with primary winding 14, and this parallel group is connected to input terminals 16 and 17, which are suitably supplied from the preceding stage of the amplifier.

The output circuit of stage 1 may be traced from the positive terminal of a source of unidirectional electrical energy, shown as a battery 18, through a wire 19, a resistor 20, anode 4, cathode 8 and resistor 13 to the grounded negative terminal of battery 18.

Control electrode 5 is connected to cathode 8, and control electrode 6 is connected to wire 19, in a conventional manner.

The output circuit of stage 1 is coupled to the input circuit of stage 2 through a resistor 21 of very high impedance and thence to ground through a parallel resonant circuit including a condenser 22 and a variable inductance coil 23.

The second stage 2 includes a pentode 24, which may be of the type commercially known as 6AK5, having an anode 25, control electrodes 26, 27 and 28 and a cathode 29.

The input circuit of stage 2 is connected between control electrode 28 and cathode 29. Across the terminals of condenser 22 are connected in series two condensers 30 and 31, which serve to divide the potential developed across the condenser 22, and cooperate with condenser 22 in the parallel resonant circuit including variable inductance 23. Control electrode 28 is connected through a resistor 32, a resistor 33 and a variable resistor 34 to the common terminal 35 of the two condensers 30 and 31. Connected in series between the cathode 29 and ground are a relatively small resistor 36, and a relatively large resistor 37 which serves as the load resistor of the stage 2. The common terminal 50 of resistors 36 and 37 is connected to resistors 32 and 33. Control electrode 28 is coupled to the ungrounded terminal of the parallel resonant circuit through a condenser 38.

The output circuit of stage 2 may be traced from the positive terminal of a source of electrical energy, shown as including a battery 39 and battery 18 in series, through a wire 40, the primary winding 41 of a coupling transformer 42, a variable tuning condenser 43 in parallel with winding 41, anode 25, cathode 29 and resistors 36 and 37 to the grounded terminal of battery 18.

The coupling transformer 42 has a secondary winding 44 connected to output terminals 45 and 46. A tuning condenser 47 is connected across the terminals of secondary winding 44. Control electrode 27 is connected to anode 25 through a resistor 48. Control electrode 26 is connected to cathode 29. A condenser 49 is connected between control electrode 27 and cathode 29.

The following table shows, by way of example, a particular set of values for the potentials of the various batteries, the resistances of the various resistors, and the capacitances of the various condensers, in a circuit which has been operated successfully. It will be understood that these values are set forth by way of example only and that the invention is not limited to these values or any of them.

*Table*

| | | |
|---|---|---|
| Pentode **3** | | Type 6BA6 |
| Resistor **13** | ohms | 75 |
| Battery **18** | volts | 100 |
| Resistor **20** | ohms | 7,500 |
| Resistor **21** | megohms | 2.2 |
| Condenser **22** | mf | 100 |
| Pentode **24** | | Type 6AK5 |
| Condensers **30** and **31** | mf | 470 |
| Resistor **32** | ohms | 470,000 |
| Resistor **33** | do | 15,000 |
| Resistor **34** | do | 10,000 |
| Resistor **36** | do | 200 |
| Resistor **37** | do | 10,000 |
| Condenser **38** | mf | .01 |
| Resistor **48** | ohms | 10,000 |
| Condenser **49** | mf | .005 |

The resistor 21 isolates the resonant circuit including condenser 22 and coil 23 from the output circuit of stage 1. Resistor 21 has an impedance many times greater than either resistor 20 or the anode-to-cathode impedance of pentode 3, and thereby prevents the effective shunting of the resonant circuit by either the anode-to-cathode impedance of pentode 3 or by the load impedance 20. Resistor 21 also increases the Q of the coupling circuit.

The resistor 37, located between terminal 50 and ground, has a high resistance as compared to resistor 36. Resistor 37 functions as a load resistor for the pentode 24, and provides typical cathode follower action in that pentode. For example, a shift in the potential of control electrode 28 in a positive sense produces an increase in the current flowing through the cathode and thence through resistor 37. The current flow through resistor 37 produces a potential drop across that resistor in a sense to make the cathode more positive, so that the cathode potential follows the control grid potential, as in any cathode follower circuit. Since this potential drop across resistor 37 also acts to make the control electrode 28 more positive, it may be seen that the resistor 37 is part of a positive feedback mechanism. This positive feedback mechanism provides, in effect, a negative resistance in parallel with the resonant circuit, thereby raising the Q of that circuit.

The resistor 36, on the other hand, produces a negative feedback effect since an increase in potential drop across it serves to make control electrode 28 more negative with respect to the cathode 29. This negative feedback effect cooperates with resistors 33 and 34 to prevent the circuit from oscillating.

The Q of the circuit and hence the sharpness of the tuning is regulated by the variable resistor 34. The greater the resistance at this point in the circuit, the higher the Q. While it would be possible to use a single variable resistor in place of the fixed resistor 33 and the variable resistor 34, it is preferred to use the arrangement shown, so that the presence of a minimum resistance in the circuit at all times in ensured.

The natural frequency of the resonant circuit is determined by adjusting the variable impedance coil 23, for example, by means of a movable core arrangement. Other equivalent arrangements for adjusting the frequency might be used. For example, condenser 22 might be made variable or condensers 30 and 31 might be made variable. Alternatively, a single condenser might be used in place of condensers 22, 30 and 31 and the terminal 35 of resistor 34 connected to a tap at an intermediate point on coil 23.

A plug-in I. F. amplifier unit employing the circuit of Fig. 1 to increase the selectivity has been designed for adaptation to existing receivers. The theory of the operation of this circuit is described mathematically as follows: The first stage 1 serves as an R-C coupled amplifier with a gain of $$G_1 = G_m R_L \tag{1}$$

where $G_m$ is the transconductance of the tube 3, and $R_L$ the resistance of load resistor 20. $R_L$ is chosen so that maximum gain is realized at the operating frequency. The second stage 2 serves two functions in this unit: (1) It acts as an amplifier with a gain given by $$G_2 = \frac{\mu_2 Zt_2}{R_P + (\mu_2 + 1) R_K + Zt_2} \tag{2}$$

where $Zt_2$ is the complex load impedance of the tuned circuit 41, 43,
$R_P$ is the plate resistance of the tube 24, and
$\mu_2$ is the amplification factor of the tube 24,
$R_K$ is the sum of the resistances in series with the cathode.

and (2) it provides the necessary negative resistance to the tuned circuit 22, 23 for high Q conditions: this is accomplished by means of the positive feedback effect produced by resistor 37 in the grid and cathode circuit. In order to prevent the parallel combination of the load resistor 20, and the plate resistance of tube 3 from shunting the tuned circuit 22, 23—which would materially lower the Q of the circuit—the series resistor 21 is used to act as a high impedance isolating resistance to minimize the loading effect of the generator internal impedance on the tuned circuit. The resistance of resistor 21 should be as high as possible for high Q multiplication.

The resistors 33 and 34 determine the selectivity of the circuit. Resistor 34 is variable so that the selectivity may be varied over a predetermined range.

The total gain which can be obtained from the plug-in unit depends on two factors: (1) The effective Q of the circuit—hence, the Q multiplication factor of the circuit; and (2) the receiver or instrument to which the unit is to be adapted. The reason for this variation in gain can best be explained by the following equations: The total gain of the unit may be expressed by $$A = G_1' G_2 \tag{3}$$

when $$G_1' = G_1 \frac{Zt_1}{R_1 + Zt_1} \tag{4}$$

and $Zt_1$ is the complex impedance of the tuned circuit composed of coil 23 and condensers 30 and 31 and $R_1$ is the resistance of resistor 21. Equation 4 represents the gain which is obtainable from the grid of tube 3 to the grid of tube 24. At resonance, the impedance of the tuned circuit 22, 23 is related to the Q by $$Zt_1 = R_t = Q_{eff} \sqrt{\frac{L_1}{C_0}} \tag{5}$$

where $R_t$ is a pure resistance and $$C_0=\frac{C_1C_2}{C_1+C_2}$$

$C_1$ and $C_2$ are respectively the capacitances of two equivalent condensers replacing condensers 22, 30 and 31. Thus at resonance Equation 4 becomes $$G_1'=G_1\frac{R_t}{R_1+R_t} \qquad (6)$$

$$G_1'=G_1\frac{Q_{eff}\sqrt{\frac{L_1}{C_0}}}{R_1+Q_{eff}\sqrt{\frac{L_1}{C_0}}}=G_1\frac{Q_{eff}}{R_1\sqrt{\frac{C_0}{L_1}}+Q_{eff}} \qquad (7)$$

which indicates that the gain $G_1'$ is dependent on the effective Q of the circuit; therefore, for high selectivity, the gain $G_1'$ will be high and vice versa. Equation 2 shows that the gain $G_2$ which is obtainable from tube $T_2$ will depend on the complex impedance of the network employed in the receiver to which the unit is to be adapted. As a result, it can be seen that the gain $$A=G_1'G_2 \qquad (8)$$

is a variable and is dependent on the two factors mentioned before.

Fig. 2 illustrates graphically the improved sharpness of tuning which may be attained by the use of intermediate frequency amplifier of this type. These curves indicate graphically the relationship between the losses in this amplifier, expressed in decibels and the frequency of the applied signal, measured in terms of the departure of that signal from the resonant frequency.

Curve 51 shows the band width characteristic of a conventional radio receiver, employing a conventional intermediate frequency amplifier circuit. Curve 52 shows the band width characteristic of the same receiver circuit when an I. F. amplifier of the type illustrated in Fig. 1 was substituted for the original I. F. amplifier in the receiver, with the resistor 34 being set for a wide band. Curve 53 shows the band width characteristic of the same receiver as curve 52, but with resistor 34 set for a very narrow band.

The sharpness of the peak in the curve 53 might make it unsuitable for use with a carrier frequency modulated by voice frequencies, since the side bands are not wide enough to transmit the voice frequencies without distortion. However, it would be suitable for reception of code signals. The set could be adjusted to the curve 52, for reception of voice modulated carrier frequency signals.

While I have shown and described a preferred embodiment of my invention, other modifications thereof will readily occur to those skilled in the art, and I therefore intend my invention to be limited only by the appended claims.

I claim:

1. A frequency selective amplifier circuit, comprising first and second amplifier stages, each including an electric translating device, an input circuit and an output circuit, means coupling the output circuit of the first stage to the input circuit of the second stage including a resistor connected to said first stage output circuit and a parallel resonant circuit connected in series with said resistor, and means coupling an intermediate point and both terminals of said parallel resonant circuit to electrically separated points in the second stage input circuit.

2. A frequency selective amplifier circuit as defined in claim 1, in which said resistor has an impedance substantially higher than the impedance of said first stage output circuit.

3. A frequency selective amplifier circuit, comprising first and second amplifier stages, each stage including an electric translating device having an anode, a cathode and at least one control electrode, an output circuit for said first stage including said anode, said cathode and a load impedance, means coupling said output circuit to the control electrode of the second stage including a resistor connected to said output circuit and a parallel resonant circuit connected betwen two terminals and in series with said resistor, said resistor having an impedance substantially greater than said load impedance and greater than the anode-cathode impedance of the translating device in said first stage, positive and negative feedback means in said second stage comprising two resistors connected in series between said cathode and a source of electrical energy, means including a band width determining resistor conductively coupling a point in said resonant circuit intermediate the two terminals thereof and the common terminal of said two resistors, and means conductively coupling said common terminal to said control electrode.

4. A frequency selective amplifier circuit as defined in claim 3, in which said parallel resonant circuit comprises inductive impedance means and capacitive impedance means, at least one of which is variable to select the resonant frequency of said resonant circuit, and said band width determining resistor is variable to vary the width of the frequency band over which said amplifier is effective.

References Cited in the file of this patent

UNITED STATES PATENTS

| | | |
|---|---|---|
| 1,985,999 | Krambeer | Jan. 1, 1935 |
| 2,152,618 | Wheeler | Mar. 28, 1939 |
| 2,243,401 | Sturley | May 27, 1941 |
| 2,586,167 | Kamm | Feb. 19, 1952 |
| 2,658,957 | Usselman | Nov. 10, 1953 |